United States Patent [19]

Chayka et al.

[11] 4,284,466
[45] Aug. 18, 1981

[54] BONDING HEAD

[75] Inventors: George A. Chayka; Fred J. Schneider, both of Northampton, Pa.

[73] Assignee: Western Electric Co., Inc., New York, N.Y.

[21] Appl. No.: 104,242

[22] Filed: Dec. 17, 1979

[51] Int. Cl.³ .................. B30B 15/02; B30B 15/34
[52] U.S. Cl. .................. 156/583.1; 100/93 P; 156/583.7; 219/78.01
[58] Field of Search .............. 156/583.1, 583.6, 583.7, 156/380, 515; 100/93 P, 295; 219/78.01, 86.8, 88

[56] References Cited

U.S. PATENT DOCUMENTS

| | | | |
|---|---|---|---|
| 3,017,315 | 1/1962 | Doyle | 156/583.1 |
| 3,519,782 | 7/1970 | Mallery | 219/119 |
| 3,738,887 | 6/1973 | Hoffmann | 156/583.1 |
| 3,884,744 | 5/1975 | Ranocha et al. | 156/380 |
| 3,933,571 | 1/1976 | Studen | 156/583.1 |
| 3,943,323 | 3/1976 | Smith et al. | 219/85 |

OTHER PUBLICATIONS

Composite Thermode Structure, T. S. Ellington IV et al., Tech. Digest, Western Electric Co., No. 31, Jul. 1973, p. 21.

Primary Examiner—Michael G. Wityshyn
Attorney, Agent, or Firm—W. O. Schellin

[57] ABSTRACT

A thermode (12) of a thermocompression bonding head (11) is adjustably mounted to a frame (35). A bonding tip (26) of the thermode (12) rests against a reference surface (17). After an initial adjustment of the thermode (12) with respect to a bonding platform (37), the bonding tip (26) may be removed from the thermode (12) and replaced by another identical tip (26) without a need for readjusting the thermode (12) with respect to the bonding platform (37). A comparatively large interface surface area between a dovetailed groove (16) and the mating surfaces of the bonding tip (26) and a wedging action of the dovetailed section urging mating surfaces against each other minimize thermal resistance across the interface between the thermode (12) and the bonding tip (26).

3 Claims, 3 Drawing Figures

BONDING HEAD

TECHNICAL FIELD

This invention relates to a bonding head, and particularly to a bonding head for use in a thermocompression bonding apparatus.

BACKGROUND OF THE INVENTION

Thermocompression bonding is a technique for joining two articles by simultaneously applying heat and pressure to an interface between the articles. Typically, neither the heat nor the pressure alone is sufficient to produce the desired bond. However, when both heat and pressure are appropriately combined a bond is produced at the interface.

Thermocompression bonding is frequently used in electronic manufacturing processes for joining electrical leads to circuits formed on substrates, particularly ceramic substrates. Typically, bond pads of the same type surface metallization as that of the leads are located along edges of the substrates. All leads along a particular edge of a substrate are typically aligned with, and simultaneously urged against, their respective pads by a bonding rail of a bonding head.

Since a predetermined, controllable amount of both pressure and heat are necessary for forming the bond so as not to damage the substrate or circuit by an excess of either, it has always been an endeavor of the practitioner to distribute the heat and pressure equally among all leads to be bonded during the same operation to obtain bonds of equal strength between all of the leads and the substrate. Heat and pressure are transferred to the leads through a major element of the bonding head which is frequently referred to as a thermode. The thermode is typically a metal body which houses one or more heating elements. A surface of the body of the thermode is typically shaped into one or more bonding rails.

Such a bonding rail bears upon any predetermined number of leads and their respective pads as are to be bonded along an edge of a substrate. In contacting the leads, the rail transfers a compressive force as well as the heat from the thermode to the leads. The rail is, consequently, subjected to severe compressive and thermal cycling stresses, as it cyclically engages and disengages the leads during successive bonding operations.

A distribution of compressive forces among all leads along the length of the rail requires delicate adjustments of the thermode with respect to a mounting frame of the head. The frame is typically mounted in a bonding apparatus to slide or translate toward and away from a bonding platform. The adjustments of the thermode orient the rail in parallel to the plane of a bonding platform which supports the substrate and the leads.

According to the prior art such adjustments are made each time a bonding rail has become deformed to a degree at which the uniformity and quality of bonds made by the rail is no longer acceptable.

Such adjustments of the thermode are typically made by trial and error. After each adjustment a group of leads are bonded to a substrate and the bonded leads are checked for uniformity of deformation in the leads. The adjustments of the thermode with respect to the frame are repeated until the deformation among the bonded leads has become uniform. A significant period of time is consequently devoted to adjusting the thermode.

SUMMARY OF THE INVENTION

It is, therefore, an object of this invention to provide an improved thermocompression bonding apparatus and particularly an improved bonding head which simplifies necessary adjustments for continued satisfactory bonds of leads to substrates.

A further object of the invention is to extend the useful life of a bonding rail.

Another object of the invention is to obtain more uniform bonds throughout a series of bonding operations.

Accordingly, the invention pertains to a bonding head of a thermocompression bonding apparatus wherein a bonding thermode is adjustably mounted with respect to a bonding platform. The thermode has a reference plane or surface to which a separate bonding element or tip is attached. The bonding tip includes at least one bonding rail.

By adjusting the thermode to position the rail in relationship to the bonding platform, the reference surface of the thermode also becomes oriented in a definite relationship to the bonding platform. The reference surface thereby becomes adjusted to locate any of a number of similar tips and their respective bonding rails in the adjusted position with respect to the bonding rail.

BRIEF DESCRIPTION OF THE DRAWING

Other features and advantages will become apparent from the detailed description below when read in reference to the accompanying drawing, wherein.

DETAILED DESCRIPTION

Figure 1:
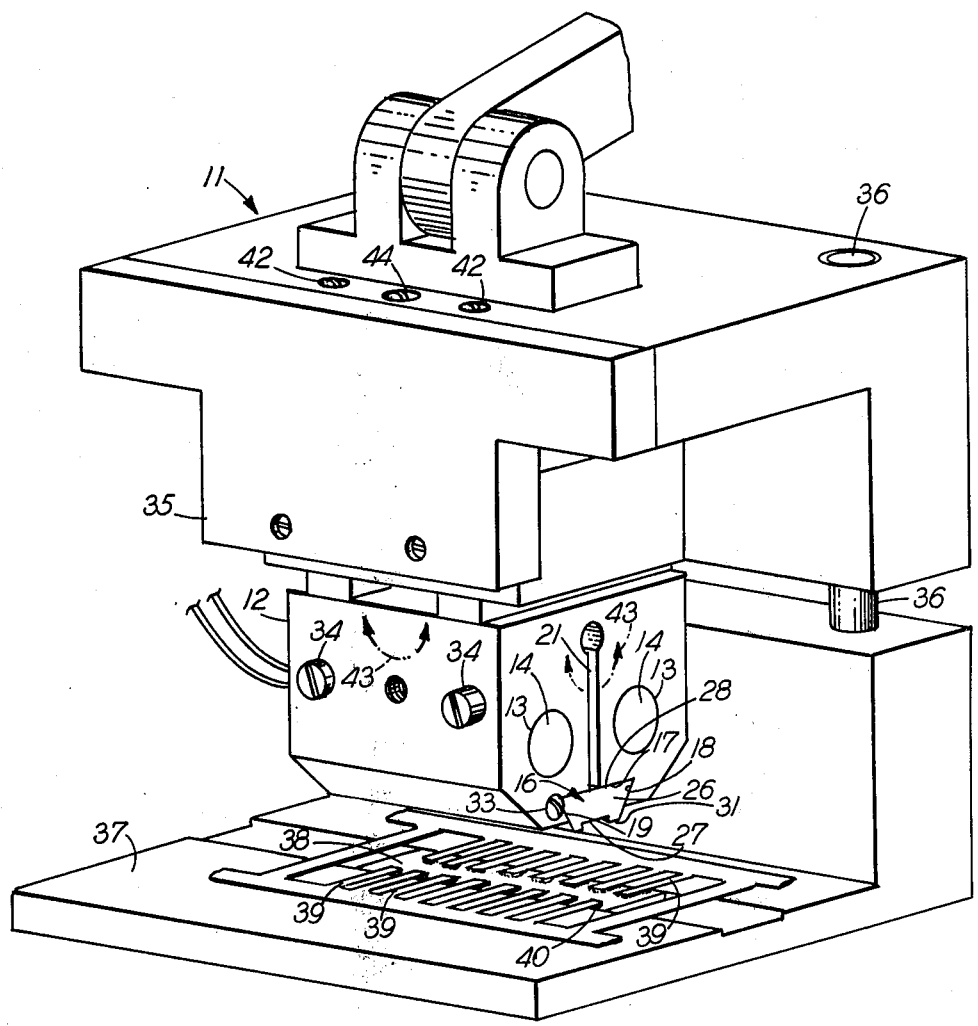
FIG. 1 is a pictorial representation of a bonding head and, in particular, an adjustable thermode in relationship to a bonding platform, the thermode showing features of the invention.

Referring now to FIG. 1 there is shown a thermocompression bonding head which is designated generally by the numeral 11. A significant element of the head is a thermode 12. The thermode 12 is typically of a material such as a metal alloy known as INCONEL which combines in a compromising ratio heat conductivity and strength at elevated temperatures. The thermode 12, when in operation, is maintained at an elevated temperature in a range between 650° and 750° C. In such a temperature range material strength, heat conductivity and a comparatively low oxidation rate are infrequently found as characteristics of a single material.

The body of the thermode 12, as shown in the preferred embodiment of FIG. 1, has two parallel cylindrical cavities 13. In each of these cavities 13 a heating element 14 is removably mounted. In proximity with the cavities 13, and in parallel to their longitudinal axes, a dovetailed groove 16 extends preferably throughout the entire length of the thermode 12. A flat reference surface 17 is bounded along two parallel longitudinal edges 18 by sloped walls 19 of the dovetail groove 16.

A longitudinal slot 21 along the center of the dovetailed groove 16 through a major portion of the thermode 12 permits approximately 0.1 mm lateral resilient expansion of the walls 19 with respect to each other. A bonding element or tip 26 which has substantially the same cross-sectional configuration as the groove 16 is located in the groove 16 and protrudes with a bonding end 27 from the groove 16 of thermode 12. A base surface 28 rests against the reference surface 17. At least one contact element or bonding rail 31 is located parallel to and spaced from the base surface 28 by preferably a predetermined distance. The bonding end 27 shows in the preferred embodiment two spaced bonding rails 31 in the form of two parallel ridges terminating as coplanar flat surfaces 32 approximately 0.7 mm in width.

A stop 33 at each end of the groove 16 limits the movement of the tip 26 in the longitudinal direction of the groove 16. Additional clamping screws 34 permit the walls 19 to be drawn toward each other to secure the position of the tip 26 within the groove 16. Other means for temporarily fastening the tip 26 to the thermode 12 appear, of course, possible, such as a direct fastening of the tip 26 into the body of the thermode 12 by, for instance, flat head screws (not shown).

As illustrated in FIG. 1, the thermode 12 is mounted to a frame 35 of the head 11. The frame 35, in turn, is slidably mounted on members 36 to permit movement from and toward a bonding platform 37. Electrical component parts such as substrates 38 and leads 39 are sequentially advanced to the platform 37 such that ends of the leads 39 and bond pads 40 on the substrates 38 become aligned with portions 41 of the bonding rails 31.

The thermode 12 is typically adjusted with respect to the frame 35 by alternately loosening and tightening adjustment screws 42 to orient the thermode 12 in various planes indicated by the arrows 43 in FIG. 1 in relationship to the frame 35. Typical lockscrews 44 fix the thermode 12 in a desired adjusted position. Such a desired position is achieved when the rails 31 contact and bear against the leads 39 uniformly. Features of the bonding tip 26 and the above-described clamping arrangement of the expansible and contractible dovetail groove 16 has been noted to have several advantages which deserve further discussion.

One of such advantages is an increased interface area between the body of the thermode 12 and the tip 26. An interface represents inherently a resistance to the natural flow of heat from the heating elements 14 to the rails 31. An increase in the interface area has been found to reduce such thermal resistance.

The thermal resistance may be further reduced by increasing the force of the walls 19 against corresponding walls 46 of the tip 26. A vertical component of such a lateral force transformed through the sloped walls 19 and 46 urges the tip 26 against the bottom surface 17 for a more intimate contact with relatively less thermal resistance across all surfaces of the interface between the thermode 12 and the tip 26.

Figure 2:
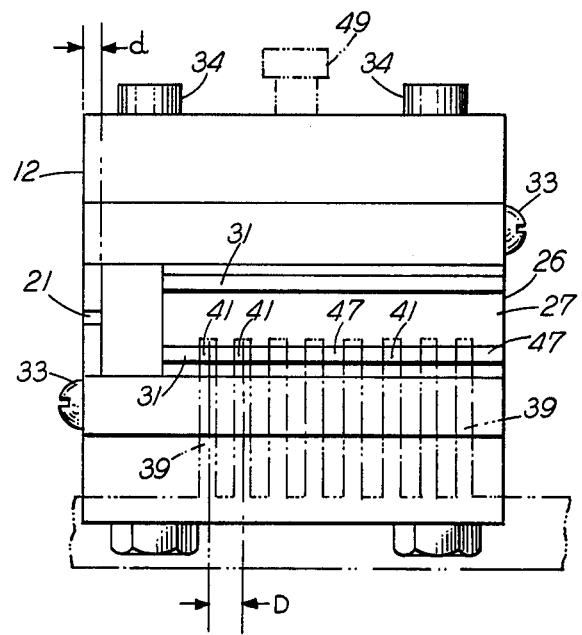
FIG. 2 shows a longitudinally shiftable bonding rail as a feature of the invention whereby the useful life of a bonding rail is extended.

In reference to FIG. 2 another advantage of the groove-retained tip 26 is illustrated. The advantage stems from a desire to increase the useful life of the tip 26. In the past, the entire thermode 12 had to be removed from a frame 36 to regrind or dress the rails 31 of the thermode after typically 100,000 bonds had been made with such a thermode. However, the rails 31 experience compression and rapid wear only in portion 41, the area which contacts the leads 39 (see FIG. 1). Thus, when the rails 31 become indented or worn at such contact portions 41 such that the compressive force against the leads 39 tends to become reduced, the tip 26 can readily be shifted to align a non-deformed portion 47 of each of the rails 31 into contact with the leads 39.

As seen in FIG. 2, the walls 19 may be expanded with respect to each other. Such an expansion frees the tip 26 for movement in the longitudinal direction of the groove 16. FIG. 2 shows the tip 26 to be shorter than the length of the groove 16 by a distance identified as "d" which is substantially one-half of the pitch "D" or distance between centers of the leads 39. A shift of the tip 26 from the stop 33 at one end of the groove 16 to about against the other of the two stops 33, realigns the rails 31 and deformed portions 41 of the rails 31 are shifted away from the contact areas with the leads 39 while the unused rail portions 47 are substituted therefor.

It is to be noted that subsequently to such a longitudinal shift of the tip 26 adjustments of the thermode 12 are not required. After such a shift of the tip 26, the surface 17 still engages and references the tip 26 and retains the vertical position of the tip 26 in the same location. Except for the desired longitudinal shift of the rails 31, no change in the vertical position or in the lateral orientation has taken place.

Figure 3:
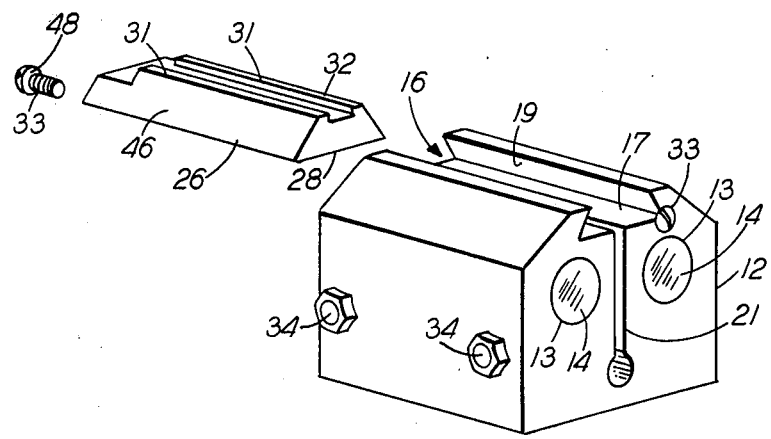
FIG. 3 shows certain features of the thermode of FIG. 1 which permit the replacement of worn bonding rails with minimal adjustments to the position of the thermode.

FIG. 3 illustrates a replacement of an expended one of the tips 26 by an unused tip 26, again without the necessity of adjusting the position of the thermode 12. The stop 33 is removable, mounted on at least one end of the groove 16. Preferably the stop 33 is the head of a screw inserted into each end of the thermode 12, a shoulder surface 48 of which protrudes to block the end of the groove 16. The removal of the screw or stop 33 as shown in FIG. 3 opens the groove 16 at that particular end. The clamping screws 34 are loosened and a jack or expansion screw 49 (see FIG. 2) is driven into the body of the thermode when it is desired to shift the tip 26 laterally. The tip 26 may now be completely removed from the groove 16 and a new tip 26 may be inserted. Since the location of the new tip 26 is determined by the walls 19 and the surface 17 of the groove 16, no adjustment needs to be made to the thermode 12.

It should be understood that various modifications and changes can be made to the described structure of the bonding head and particularly the thermode without departing from the spirit and scope of the invention.

What is claimed is:

1. A thermocompression bonding head for bonding electrical component parts, which comprises:

a thermode including a body having at least one cavity for mounting a heating element, a dovetailed groove extending in the body adjacent to said cavity, said dovetailed groove being formed by two opposite, inwardly diverging sidewalls intersecting a flat reference surface, said reference surface being parted by a slot extending into said body to a depth sufficient for resiliently hinging the portion of said body on one side of said slot with respect to the portion of said body on the other side of said slot; and a bonding element having a base reference surface, inwardly sloping sidewalls adjoining said base reference surface at two parallel edges thereof and a bonding end having at least one bonding rail extending parallel to said parallel edges, said bonding element being insertable into said groove upon a resilient expansion of said sidewalls of said groove with respect to each other, such that, upon said bonding element being inserted within said groove, said base reference surface is adjacent to said reference surface of said groove, said bonding end protrudes from said groove, the sidewalls of the groove resiliently bear on the sidewalls of the bonding element, and the reference surface on the thermode and the base reference surface of the bonding element are located in mutual, intimate, heat conducting contact.

2. A thermocompression bonding head according to claim 1, wherein said groove in the body of the thermode includes means for restricting a slidable movement of said bonding element in the direction of said parallel edges between first and second predetermined positions, upon said sidewalls of said groove becoming expanded with respect to each other, said first and second positions being mutually spaced by substantially one half of a distance between adjacent conductive elements of a lead frame to be joined to conductive bond pads on a substrate, whereby through a slidable movement of said bonding element from said first to said second position first portions of said at least one rail are shifted away from a contactable position between said bonding head and said conductive elements of said lead frame and second portions of said at least one rail are substituted therefor.

3. A thermocompression bonding head according to claim 2, further comprising:
means for adjustably mounting said thermode to a frame structure, to orient and position said at least one bonding rail with respect to a bonding platform; and
means for resiliently expanding the sidewalls of the body of the thermode with respect to each other without altering the position of the reference surface of the groove in the body of the thermode relative to the bonding platform as established by said adjustable mounting means.

* * * * *